(12) United States Patent
Wu

(10) Patent No.: US 9,382,622 B2
(45) Date of Patent: Jul. 5, 2016

(54) GLASS SUBSTRATE FOR DISPLAY AND MANUFACTURING METHOD THEREOF

(71) Applicant: SHENZHEN CHINA STAR OPTOELECTRONICS TECHNOLOGY CO., LTD., Shenzhen, Guangdong (CN)

(72) Inventor: Chih Hao Wu, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 181 days.

(21) Appl. No.: 14/240,375

(22) PCT Filed: Jan. 28, 2014

(86) PCT No.: PCT/CN2014/071702
§ 371 (c)(1),
(2) Date: Jul. 30, 2014

(87) PCT Pub. No.: WO2015/081634
PCT Pub. Date: Jun. 11, 2015

(65) Prior Publication Data
US 2015/0162946 A1    Jun. 11, 2015

(30) Foreign Application Priority Data
Dec. 6, 2013    (CN) .......................... 2013 1 0656370

(51) Int. Cl.
*B32B 17/06*    (2006.01)
*C03C 17/09*    (2006.01)
(Continued)

(52) U.S. Cl.
CPC ............... *C23C 16/46* (2013.01); *C03C 17/001* (2013.01); *C03C 2218/152* (2013.01); *Y10T 428/24926* (2015.01)

(58) Field of Classification Search
USPC .......... 428/426, 432, 409; 204/192.1, 298.01, 204/298.09; 65/60.1, 162, 413
See application file for complete search history.

(56) References Cited

U.S. PATENT DOCUMENTS

| 2009/0091682 A1* | 4/2009 | Murakami | G02B 27/281 349/61 |
| 2009/0230415 A1* | 9/2009 | Ide | H01L 27/3209 257/98 |

(Continued)

FOREIGN PATENT DOCUMENTS

| CN | 101295108 A | 10/2008 |
| CN | 101430944 A | 5/2009 |

(Continued)

OTHER PUBLICATIONS

Chinese Office Action dated Sep. 25, 2015.
(Continued)

*Primary Examiner* — Lauren R Colgan
(74) *Attorney, Agent, or Firm* — Stein IP, LLC

(57) ABSTRACT

The present disclosure relates to the field of liquid crystal display, and particularly to a glass substrate for a display. The glass substrate is treated through a vapor deposition apparatus, and includes an optical compensation film. The optical compensation film has a relatively higher transmittance in a compensation area than in other areas, and the shape and position of the compensation area are configured to be consistent with a non-uniform heated area caused by the vapor deposition apparatus on the glass substrate. The present disclosure further relates to a corresponding method for manufacturing the glass substrate. According to the present disclosure, the defects of the glass substrate can be accurately overcome and the mura phenomenon of the display panel can be reduced.

19 Claims, 2 Drawing Sheets

(51) Int. Cl.
  *C23C 16/46* (2006.01)
  *C03C 17/00* (2006.01)

(56) References Cited

U.S. PATENT DOCUMENTS

2010/0047468 A1* 2/2010 Yeh .................. G02F 1/133555
                                                          427/519
2013/0107342 A1* 5/2013 Hwang .................. G09F 13/08
                                                          359/238

FOREIGN PATENT DOCUMENTS

| CN | 101666462 A | 3/2010 |
| CN | 102197331 A | 9/2011 |
| CN | 202182992 A | 4/2012 |
| CN | 102633442 A | 8/2012 |
| CN | 103048832 A | 4/2013 |
| CN | 103069329 A | 4/2013 |
| JP | 2003270636 A | 9/2003 |
| JP | 2007086406 * | 4/2007 |
| JP | 2014003137 * | 1/2014 |
| KR | 20030081540 A | 10/2003 |
| WO | WO2014050408 * | 4/2014 |

OTHER PUBLICATIONS

International Search Report mailed Sep. 11, 2014, issued to International Application No. PCT/CN2014/071702.

* cited by examiner

GLASS SUBSTRATE FOR DISPLAY AND MANUFACTURING METHOD THEREOF

FIELD OF THE INVENTION

The present disclosure relates to a glass substrate for a display, and a method for manufacturing the glass substrate, which is particularly suitable for manufacturing the glass substrate treated through a vapor deposition apparatus.

BACKGROUND OF THE INVENTION

A large quantity of new materials with different functions is used in modern science and technology. These functional materials must be of high-purity, or a certain impurities are intentionally doped into the high-purity materials to form doped materials. However, it is difficult to meet these requirements through many traditional preparation methods, such as high-temperature smelting and precipitation, crystallization in aqueous solutions, and the like. Therefore, it cannot be ensured to obtain high-purity products.

Chemical vapor deposition (CVD) is a process that reactive materials are subjected to chemical reaction under a gaseous condition so as to generate a solid substance deposited on the surface of a heated solid matrix, so that a solid material is obtained. The process essentially belongs to a gaseous mass transfer process in the atomic domain.

As a new technology, CVD has been developed in recent decades for preparation of materials. The CVD method has been widely used for extracting materials, developing new crystals, and depositing various monocrystalline, polycrystalline or vitreous film materials. These materials may be oxides, sulfides, nitrides and carbides, or binary or polynary element compounds in III-V, II-IV and IV-VI families, and the physical functions of the materials can be accurately controlled through a vapor doping deposition process.

In contrast, physical vapor deposition (PVD) is a process that the surface of a material source, namely a solid or liquid, is gasified into gaseous atoms or molecules or partially ionized into ions under vacuum by adopting a physical method, and a film with a certain special function is deposited on the surface of a matrix through a low-pressure gas (or plasma) process. Main methods of PVD include vacuum evaporation, sputter coating, arc plasma plating, ion coating, molecular beam epitaxy and the like. At present, the PVD technology may not only be used for depositing metal films and alloy films, but also may be used for depositing compounds, ceramics, semiconductors, polymer films and the like.

A vapor deposition apparatus generally includes a reaction chamber, a gas supply system and a heating system. The reaction chamber includes a support for supporting a substrate to be treated, such as lift pins and the like, and the heating system includes a heating plate for example, on which a heating resistance wire is arranged.

A display panel treated by the vapor deposition process often suffers a phenomenon of mura due to process uniformity. This phenomenon may be caused by a structural design which has to be complied with on machine hardware in the manufacturing process, or by inherent compatibility restriction between raw materials and the technology. Consequently, the phenomenon of mura with a fixed shape and a fixed range of size will be generated at a specific position of a large glass plate.

Upon investigation, the inventors found the source for the technical problem.

FIG. 1 schematically shows a heating plate 10 in a vapor deposition apparatus for treating a glass substrate in the prior art. With reference to FIG. 1, a heating resistance wire 3 is generally arranged on the heating plate 10 in the vapor deposition apparatus for treating the glass substrate, and lift pins 2 are placed exactly corresponding to the position of the glass substrate in a display area.

FIG. 2 shows a schematic diagram of a vapor deposition process for a glass substrate 1 of a display. Correspondingly, in the vapor deposition process for the glass substrate 1, the glass substrate 1 may be heated in a non-uniform manner in view of the presence of the lift pins 2 and the resistance wire 3. Generally speaking, the temperature at a position corresponding to the resistance wire 3 is relatively high, whereas the temperatures at the positions corresponding to the lift pins 2 are relatively low. Therefore, the process quality and optical property of the glass substrate will be negatively affected. As a rule, the glass substrate treated through the vapor deposition process has a relatively low transmittance at the positions corresponding to the lift pins 2 or the resistance wire 3, so that the display panel finally obtained suffers from the phenomenon of mura. This significantly reduces the performance and value of the display panel.

SUMMARY OF THE INVENTION

Aiming at the above-mentioned problem in the prior art that a mura phenomenon is finally generated in a display panel in view of transmittance difference caused by non-uniform heating of a glass substrate treated in the vapor deposition apparatus during the vapor deposition process, the present disclosure proposes a glass substrate for a display and a method for manufacturing the glass substrate, with which the defect of mura can be effectively eliminated.

The present disclosure proposes a glass substrate for a display. In embodiment 1, the glass substrate is treated through a vapor deposition apparatus, wherein the glass substrate includes an optical compensation film, which has a relatively higher transmittance in a compensation area than in other areas, the shape and position of the compensation area being configured to be consistent with a non-uniform heated area caused by the vapor deposition apparatus on the glass substrate. In such a manner, the optical compensation film can change the intensity distribution of light received by a viewer through changing the propagation path of the light, so that the light intensity of pictures viewed by the viewer is distributed uniformly, thus relieving the mura phenomenon of the display panel. This mura phenomenon is caused by non-uniform heating of the glass substrate 1 in the vapor deposition apparatus, namely, the temperature is either higher or lower than a standard temperature, so that the transmittance at this position declines to an extent. The compensation area on the optical compensation film is exactly located at said position, so that the defect of the glass substrate can be overcome accurately.

In embodiment 2 derived from embodiment 1, the non-uniform heated area includes positions of the glass substrate corresponding to lift pins of the vapor deposition apparatus and/or a heating resistance wire of a heating plate. According to researches, the difference between the temperatures at the two positions and a standard temperature is particularly large. In general, the temperature at the position corresponding to the lift pins is lower than the standard temperature, whereas the temperature at the position corresponding to the heating resistance wire is higher than the standard temperature. Thus, the compensation area of the optical compensation film of the glass substrate according to the present disclosure preferably includes the two positions.

In embodiment 3 derived from embodiment 1 or 2, the optical compensation film includes optical microstructures capable of increasing the transmittance. In essence, the optical microstructures are used to change the refraction angle of light through selection of different materials, and re-direct the light, so as to meet the design requirement for optical path. The optical microstructures may include particle-like protrusions, for example.

In embodiment 4 derived from embodiment 3, optical microstructures can be provided in the compensation area of the optical compensation film in such a manner that the density of optical microstructures is relatively higher in the compensation area than in other areas. In this manner, the transmittance of the glass substrate in the compensation area can be improved.

In embodiment 5 derived from embodiment 3 or 4, optical microstructures can be provided in the compensation area of the optical compensation film in such a manner that the transmittance of the optical microstructures is relatively higher in the compensation area than in other areas. In this manner, the transmittance of the glass substrate in the compensation area can be improved.

In embodiment 6 derived from any of embodiments 1 to 5, the vapor deposition apparatus is a chemical vapor deposition chamber. The chemical vapor deposition chamber has been widely used in the process of manufacturing the glass substrate for the liquid crystal display.

In embodiment 7 derived from any of embodiments 1 to 6, the optical compensation film is attached to the surface of the glass substrate. The optical compensation film can be attached to the glass substrate through various methods, which are known per se by those skilled in the art.

The present disclosure further proposes a method for manufacturing the glass substrate, including the following steps: (a) performing vapor deposition on the glass substrate; and (b) coating an optical compensation film on the glass substrate obtained through step (a), wherein the optical compensation film has a relatively higher transmittance in a compensation area than in other areas, and the shape and position of the compensation area are configured to be consistent with a non-uniform heated area on the glass substrate caused by the vapor deposition apparatus.

As mentioned above, this mura phenomenon is caused by non-uniform heating of the glass substrate in the vapor deposition apparatus, namely, the temperature of which is either higher or lower than a standard temperature, so that the transmittance at this position declines to an extent. The compensation area on the optical compensation film is exactly located at said position, so that the defect of the glass substrate can be overcome accurately.

Preferably, the non-uniform heated area includes positions of the glass substrate corresponding to the lift pins of the vapor deposition apparatus and/or the heating resistance wire of the heating plate. Generally, the temperature at the position corresponding to the lift pins is lower than the standard temperature, whereas the temperature at the position corresponding to the heating resistance wire is higher than the standard temperature. Therefore, it is preferred to compensate the two positions particularly.

Preferably, optical microstructures capable of increasing the transmittance are arranged on the optical compensation film, and the optical microstructures with a relatively higher density are arranged in the compensation area of the optical compensation film than in other areas, or optical microstructures with a relatively high transmittance may also be arranged in the compensation area of the optical compensation film than in other areas.

According to the glass substrate of the present disclosure, the optical compensation film in the compensation area can possess a high transmittance through changing the density or transmittance of the optical microstructures of the optical compensation film. The position of the compensation area can be selected according to the vapor deposition apparatus and actual conditions of the vapor deposition process. In such a manner, the defect of the glass substrate can be effectively and accurately eliminated. Meanwhile, the mura phenomenon of the display panel can be relieved, and the intensity of light received by a viewer is uniformly distributed in the whole display area.

The above-mentioned technical features may be combined in various appropriate manners or substituted by equivalent technical features, as long as the objective of the present disclosure can be fulfilled.

BRIEF DESCRIPTION OF THE DRAWINGS

The present disclosure will be described in more detail below based on nonfinite examples with reference to the accompanying drawings. In the drawings.

Figure 1:
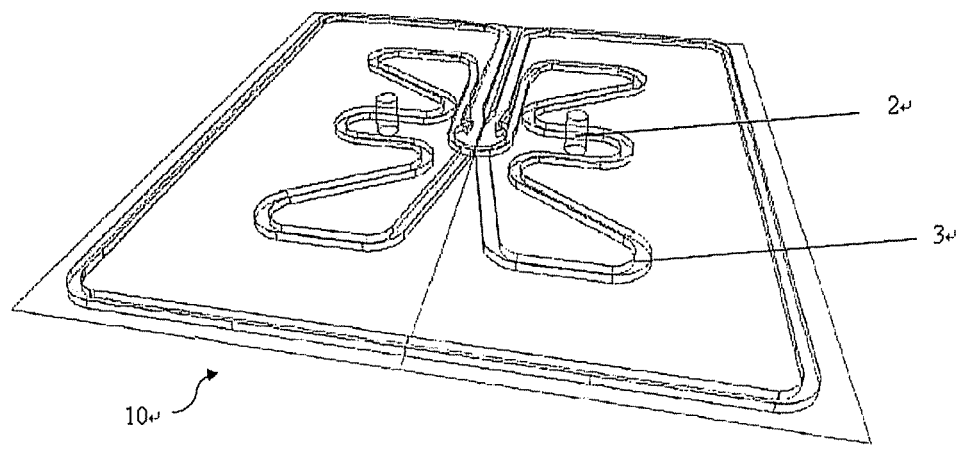
FIG. 1 shows a traditional heating plate of a vapor deposition apparatus for a glass substrate of a display.

In the drawings, the same components are indicated by the same reference signs. The accompanying drawings are not drawn in an actual scale.

DETAILED DESCRIPTION OF THE EMBODIMENTS

In the following, the present disclosure will be introduced in detail with reference to the accompanying drawings.

FIG. 1 schematically shows a heating plate 10 in a vapor deposition apparatus for treating a glass substrate in the prior art. With reference to FIG. 1, a heating resistance wire 3 is generally arranged on the heating plate 10 in the vapor deposition apparatus for treating the glass substrate, and lift pins 2 are placed exactly corresponding to the position of the glass substrate in a display area. The vapor deposition apparatus is a chemical vapor deposition chamber, for example.

Figure 2:
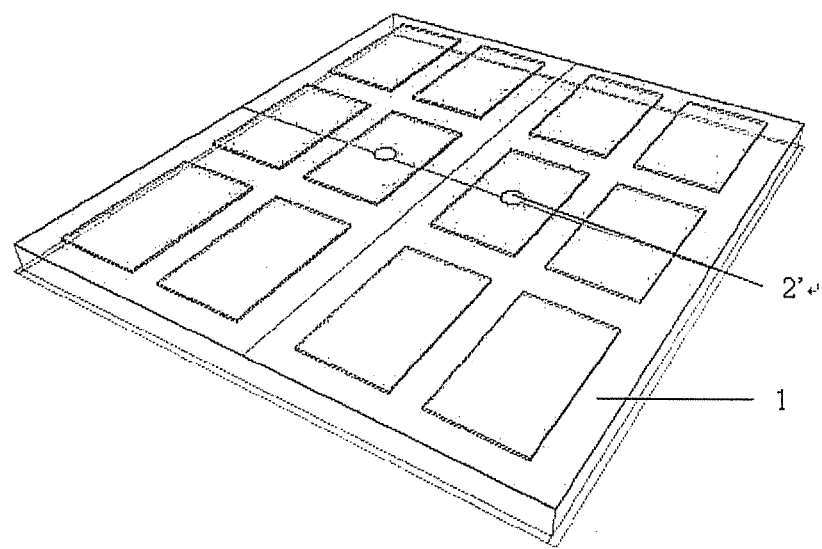
FIG. 2 shows the glass substrate and the heating plate in the vapor deposition apparatus.

FIG. 2 shows a schematic diagram of a vapor deposition process for a glass substrate 1 of a display. Correspondingly, in the vapor deposition process for the glass substrate 1, the glass substrate 1 may be heated in a non-uniform manner in view of the presence of the lift pins 2 and the resistance wire 3. Generally speaking, the temperature at a position corresponding to the resistance wire 3 is relatively high, whereas the temperatures at the positions corresponding to the lift pins 2 are relatively low. Therefore, the process quality and optical property of the glass substrate will be negatively affected. As a rule, the glass substrate treated through the vapor deposition process has a relatively low transmittance at the positions corresponding to the lift pins 2 or the resistance wire 3, so that the display panel finally obtained suffers from the phenomenon of mura.

Figure 3:
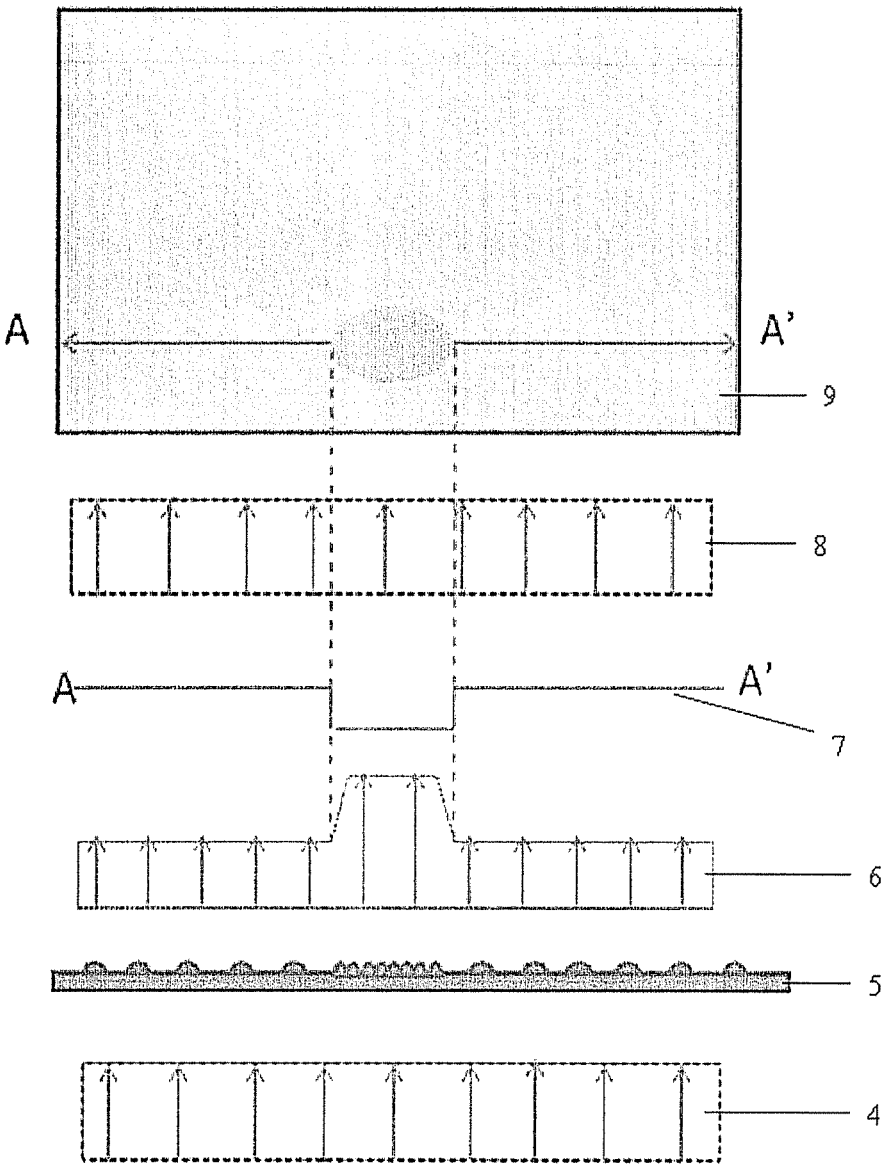
FIG. 3 shows an optical compensation film of a glass substrate according to the present disclosure and the optical effect associated therewith.

FIG. 3 shows an optical compensation film of a glass substrate according to the present disclosure and the optical effect associated therewith.

FIG. 3, in its top portion, schematically shows a display area 9 with the mura phenomenon when no compensation is adopted. It could be seen that in a partial region which corresponds to the above-mentioned non-uniform temperature area in the vapor deposition apparatus (namely, a compensation area need to be optically compensated), the display color of the non-compensated display area 9 is relatively dark. The remaining portions of FIG. 3 corresponds to the profile of the display area 9 along A-A' line.

With reference to FIG. 3, the schematic diagram at the lowermost portion thereof shows an original backlight intensity distribution 4 in the display. It could be seen that the backlight intensity is distributed in a homogenous manner. FIG. 3 shows an optical compensation film 5 of the glass substrate according to the present disclosure in the portion thereof above the original backlight intensity distribution 4, and further shows a light intensity distribution 6 after the light from a backlight passes through the optical compensation film 5 in the portion thereof above the optical compensation film 5. It could be seen that in this case, the light intensity in the compensation area is higher than that in other areas. In the portion above the light intensity distribution 6, FIG. 3 shows a gray-scale difference 7 caused by the mura phenomenon of the glass substrate. It could be seen that an image in the compensation area is concave. In the portion above the gray-scale difference 7, FIG. 3 shows a light intensity distribution 8 after the light passes through the glass substrate including the optical compensation film 5. It could be seen that the light intensity distribution 8 is uniform in the whole display area, and is the one finally received by human eyes.

It could be seen that after the light from the original backlight passes through the optical compensation film 5 and the glass substrate with a transmittance difference, the light finally received by a user is in a homogenous form. In such a manner, the mura phenomenon of the glass substrate treated through the vapor deposition process can be eliminated, so that the objective of the present disclosure can be fulfilled. The optical compensation film 5 may be, for example, attached to the surface of the glass substrate to be compensated, and the compensation area of the optical compensation film corresponds to the mura area of the glass substrate.

However, the compensation area in FIG. 3 is shown schematically. The shape and position of the compensation area may correspond to any non-uniform heated area of the glass substrate 1 in the vapor deposition apparatus. The optical compensation film 5 has a relatively higher transmittance in the compensation area than in other areas.

With reference to FIG. 1 and FIG. 2, the non-uniform heated positions may include areas of the glass substrate 1 corresponding to the lift pins 2 of the vapor deposition apparatus and/or the heating resistance wire 3 of the heating plate 10. For example, in the condition as shown in FIG. 1, the compensation area is in a circular shape consistent with the shape of the cross section of each lift pin 2 along the horizontal plane. Meanwhile, as shown in FIG. 1, the heating resistance wire 3 includes a coil extending on the plane of the heating plate 10, and in this case, the shape and position of the compensation area correspond to the running path of the coil.

The transmittance of the optical compensation film 5 can be controlled in multiple manners. The optical compensation film 5 may include optical microstructures capable of increasing the transmittance. In essence, the optical microstructures are used to change the refraction angle of light through selection of different materials, and re-direct the light, so as to meet the design requirement for optical path. The optical microstructures may include particle-like protrusions, for example.

In order to enable the optical compensation film 5 has a relatively higher transmittance in the compensation area than in other areas, optical microstructures arranged in a relatively high density can be provided in the compensation area of the optical compensation film 5, namely, as the optical compensation film 5 in FIG. 3. As an additional or alternative embodiment, optical microstructures with a relatively higher transmittance than in other areas of the optical compensation film 5 may also be arranged in the compensation area of the optical compensation film 5.

The present disclosure also proposes a method for manufacturing the glass substrate, including the following steps: (a) performing vapor deposition on the glass substrate 1; and (b) coating an optical compensation film 5 on the glass substrate obtained through step (a), wherein the optical compensation film 5 has a relatively higher transmittance in a compensation area than in other areas, and the shape and position of the compensation area are configured to be consistent with a non-uniform heated area on the glass substrate 1 caused by the vapor deposition apparatus.

The mura phenomenon is shown as the display area 9 in FIG. 3. This phenomenon is caused by non-uniform heating of the glass substrate 1 in the vapor deposition apparatus; namely, the temperature is either higher or lower than a standard temperature, so that the transmittance at this position declines to an extent. Therefore, the display area 9 has a relatively dark color in the compensation area. The compensation area on the optical compensation film 5 is exactly located at said position, so that the defects of the glass substrate can be overcome accurately.

Preferably, the non-uniform heated area includes positions of the glass substrate corresponding to the lift pins 2 of the vapor deposition apparatus and/or the heating resistance wire 3 of the heating plate. Generally, the temperature at the position 2' corresponding to the lift pins 2 is lower than the standard temperature, whereas the temperature at the position corresponding to the heating resistance wire is higher than the standard temperature. Therefore, it is preferred to compensate the two positions particularly.

Preferably, optical microstructures capable of increasing the transmittance are arranged on the optical compensation film 5, and the optical microstructures with a relatively higher density are arranged in the compensation area of the optical compensation film than in other areas. It could be seen that the optical compensation film 5 in FIG. 3 has a densely-distributed particle-like protrusions in the compensation area, and the protrusions form the optical microstructures. Optionally, optical microstructures with a relatively higher transmittance may also be arranged in the compensation area of the optical compensation film than in other areas, so as to increase the transmittance of the optical compensation film in the compensation area.

According to the glass substrate of the present disclosure, the optical compensation film in the compensation area can possess a high transmittance through changing the density or transmittance of the optical microstructures of the optical compensation film. The position of the compensation area can be selected according to the vapor deposition apparatus and vapor deposition process conditions. In such a manner, the defects of the glass substrate can be effectively and accurately eliminated. Meanwhile, the mura phenomenon of the display panel can be relieved, and the intensity of light received by a viewer is uniformly distributed in the whole display area.

Although the present disclosure has been described with reference to the preferred examples, various modifications could be made to the present disclosure without departing from the scope of the present disclosure and components in the present disclosure could be substituted by equivalents. The present disclosure is not limited to the specific examples disclosed in the description, but includes all technical solutions falling into the scope of the claims.

The invention claimed is:

1. A glass substrate used for a display and treated through a vapor deposition apparatus, wherein the glass substrate includes an optical compensation film, which has a relatively higher transmittance in a compensation area than in other areas, the shape and position of the compensation area being configured to be consistent with a non-uniform heated area caused by the vapor deposition apparatus on the glass substrate.

2. The glass substrate according to claim 1, wherein the vapor deposition apparatus is a chemical vapor deposition chamber.

3. The glass substrate according to claim 1, wherein the optical compensation film is attached to the surface of the glass substrate.

4. The glass substrate according to claim 1, wherein the non-uniform heated area includes positions of the glass substrate corresponding to lift pins of the vapor deposition apparatus and/or a heating resistance wire of a heating plate.

5. The glass substrate according to claim 4, wherein the vapor deposition apparatus is a chemical vapor deposition chamber.

6. The glass substrate according to claim 4, wherein the optical compensation film is attached to the surface of the glass substrate.

7. The glass substrate according to claim 4, wherein the optical compensation film includes optical microstructures capable of increasing the transmittance.

8. The glass substrate according to claim 7, wherein the vapor deposition apparatus is a chemical vapor deposition chamber.

9. The glass substrate according to claim 7, wherein the optical compensation film is attached to the surface of the glass substrate.

10. The glass substrate according to claim 7, wherein said optical microstructures are provided in the compensation area of the optical compensation film in such a manner that the density of optical microstructures is relatively higher in the compensation area than in other areas.

11. The glass substrate according to claim 10, wherein the vapor deposition apparatus is a chemical vapor deposition chamber.

12. The glass substrate according to claim 10, wherein the optical compensation film is attached to the surface of the glass substrate.

13. The glass substrate according to claim 7, wherein said optical microstructures are provided in the compensation area of the optical compensation film in such a manner that the transmittance of said optical microstructures is relatively higher in the compensation area than in other areas.

14. The glass substrate according to claim 13, wherein the vapor deposition apparatus is a chemical vapor deposition chamber.

15. The glass substrate according to claim 5, wherein the optical compensation film is attached to the surface of the glass substrate.

16. A method for manufacturing a glass substrate, including the following steps:
    (a) performing vapor deposition on the glass substrate; and
    (b) coating an optical compensation film on the glass substrate obtained through step (a),
    wherein the optical compensation film has a relatively higher transmittance in a compensation area than in other areas, and the shape and position of the compensation area are configured to be consistent with a non-uniform heated area on the glass substrate caused by the vapor deposition apparatus.

17. The method according to claim 16, wherein optical microstructures capable of increasing the transmittance are arranged on the optical compensation film, and
    the optical microstructures are arranged with a relatively higher density in the compensation area of the optical compensation film than in other areas, or the optical microstructures are arranged with a relatively higher transmittance in the compensation area of the optical compensation film than in other areas.

18. The method according to claim 16, wherein the non-uniform heated area includes positions of the glass substrate corresponding to the lift pins of the vapor deposition apparatus and/or the heating resistance wire of the heating plate.

19. The method according to claim 18, wherein optical microstructures capable of increasing the transmittance are arranged on the optical compensation film, and
    the optical microstructures are arranged with a relatively higher density in the compensation area of the optical compensation film than in other areas, or the optical microstructures are arranged with a relatively higher transmittance in the compensation area of the optical compensation film than in other areas.

* * * * *